US009562285B2

(12) United States Patent
Suzuki et al.

(10) Patent No.: US 9,562,285 B2
(45) Date of Patent: Feb. 7, 2017

(54) FILM FORMING METHOD, FILM FORMING APPARATUS AND STORAGE MEDIUM

(71) Applicant: TOKYO ELECTRON LIMITED, Tokyo (JP)

(72) Inventors: Keisuke Suzuki, Nirasaki (JP); Hiroki Murakami, Nirasaki (JP); Shingo Hishiya, Nirasaki (JP); Kentaro Kadonaga, Nirasaki (JP); Minoru Obata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/657,524

(22) Filed: Mar. 13, 2015

(65) Prior Publication Data

US 2015/0259796 A1 Sep. 17, 2015

(30) Foreign Application Priority Data

Mar. 17, 2014 (JP) .................................. 2014-053628

(51) Int. Cl.
*C23C 16/455* (2006.01)
*C23C 16/30* (2006.01)
*C23C 16/44* (2006.01)

(52) U.S. Cl.
CPC ........... *C23C 16/30* (2013.01); *C23C 16/4408* (2013.01); *C23C 16/45529* (2013.01); *C23C 16/45531* (2013.01)

(58) Field of Classification Search
None
See application file for complete search history.

(56) References Cited

U.S. PATENT DOCUMENTS

| 2007/0077366 A1* | 4/2007 | Keum ................. C23C 14/48 427/523 |
| 2010/0129548 A1* | 5/2010 | Sneh .................. C23C 16/4409 427/248.1 |
| 2013/0239893 A1* | 9/2013 | Suzuki ............. H01L 21/02104 118/724 |

FOREIGN PATENT DOCUMENTS

| JP | 2006-190788 A | 7/2006 |
| JP | 2006-270016 A | 10/2006 |
| JP | 2006-287194 A | 10/2006 |
| JP | 2008-053326 A | 3/2008 |
| JP | 2008-060455 A | 3/2008 |
| JP | 2009-065203 A | 3/2009 |

(Continued)

*Primary Examiner* — Joseph Miller, Jr.
(74) *Attorney, Agent, or Firm* — Nath, Goldberg & Meyer; Jerald L. Meyer

(57) ABSTRACT

A method of forming a thin film containing a doping element in a vacuum atmosphere, which includes: supplying a source gas into a processing vessel being under the vacuum atmosphere through a source gas supply unit such that a source of the source gas is adsorbed onto a substrate in the processing vessel; repeating, a plurality of times, a sequence of operations of supplying a doping gas containing the doping element into the processing vessel through a doping gas supply unit, followed by sealing the doping gas inside the processing vessel, followed by vacuum-exhausting the processing vessel; supplying a reaction gas into the processing vessel through a reaction gas supply unit such that the reaction gas reacts with the source to produce a reaction product; and replacing an internal atmosphere of the processing vessel, the replacing being performed between the operations.

3 Claims, 11 Drawing Sheets

(56) References Cited

FOREIGN PATENT DOCUMENTS

| | | |
|---|---|---|
| JP | 2010-028095 A | 2/2010 |
| JP | 2011-082493 A | 4/2011 |
| JP | 2012-142482 A | 7/2012 |
| JP | 2013-041879 A | 2/2013 |

* cited by examiner

FILM FORMING METHOD, FILM FORMING APPARATUS AND STORAGE MEDIUM

CROSS-REFERENCE TO RELATED APPLICATION

This application claims the benefit of Japanese Patent Application No. 2014-053628, filed on Mar. 17, 2014, in the Japan Patent Office, the disclosure of which is incorporated herein in its entirety by reference.

TECHNICAL FIELD

The present disclosure relates to a film forming method and apparatus, which form a thin film on a substrate, and a storage medium on which the film forming method is stored.

BACKGROUND

As an apparatus which forms a thin film (e.g., silicon nitride (Si—N) film) on a substrate such as a semiconductor wafer (hereinafter, referred to as a "wafer"), there is known a batch type vertical heat treatment apparatus which forms a film on each of the wafers received in a vertical reaction tube at a time. A specific film forming method using such an apparatus includes a so-called ALD (Atomic Layer Deposition) technique that alternately supplies, a plurality of times, for example, a silicon-containing source gas and a reaction gas (e.g., ammonia ($NH_3$) gas) for nitriding the source gas.

An object to which the silicon nitride film is applied may include a sidewall for protecting a lateral side of a gate electrode, among for example, a variety of parts constituting a semiconductor device. Specifically, a substantially cylindrical layered structure of a gate insulation film followed by a gate electrode is formed on a surface of a wafer. A silicon nitride film is formed to cover the structure. Thereafter, a mask is formed leaving only the silicon nitride film on a lateral surface of the structure. Subsequently, the silicon nitride film is subjected to a wet etching by, e.g., an etchant such as a hydrofluoric acid (HF) solution, thus forming the sidewall. Subsequently, contact electrodes for wiring between the gate electrode and drain and source regions are formed by performing, e.g., a sequence of processes of forming an insulation film such as a silicon oxide film; forming through-holes in the insulation film; and filling the through-holes with a metal material. The drain and source regions are formed in the vicinity of the gate electrode on the surface of the wafer.

In recent years, with the miniaturization of a wiring structure, the area between the gate electrode and the contact electrodes tends to be narrowed. A parasitic capacitance also tends to occur between the gate electrode and the contact electrodes. Therefore, to suppress an electrical coupling between the gate electrode and the contact electrodes, a dielectric constant (k value) of the sidewall should be properly lowered. As an example, doping the silicon nitride film with oxygen (O) is under consideration.

However, when the silicon nitride film is doped with oxygen, the sidewall is prone to be etched in the wet etching process. As such, in a case where the silicon nitride film is applied as the sidewall, doping the silicon nitride film with both oxygen and carbon (C) is under consideration as way to obtain an etching resistance of the sidewall.

As described above, the doping of the silicon nitride film with carbon generates a composition where a portion of the silicon element in a basic skeleton structure (Si—N) is replaced with the carbon element, which fails to obtain a thin film having a desired composition ratio. In a film forming cycle of alternately supplying the source gas and the reaction gas, the thin film is doped with the carbon element using a carbon-containing gas separate from the source gas and the reaction gas. This causes a concentration gradient of gas in the reaction tube in a vertical direction, which results in a variation in composition ratio of thin films between wafers. In other words, it is difficult to form a thin film having a desired composition ratio for each wafer in the reaction tube.

There are known a method of changing a processing pressure when a source gas is supplied or a method of supplying a source gas while stopping a process of exhausting a processing atmosphere, in the ALD process. In addition, there is known a method of repeating, a plurality of times, a step of supplying an ozone ($O_3$) gas and a step of exhausting a processing atmosphere. However, such methods do not describe the aforementioned problems and related techniques.

SUMMARY

The present disclosure has been made in consideration of the above points. Some embodiments of the present disclosure is to provide a technique capable of forming a thin film of which the composition ratio has a setting value or a value close to the setting value when the thin film is doped with a doping element.

According to one embodiment of the present disclosure, there is provided a method of forming a thin film containing a doping element in a vacuum atmosphere, including: supplying a source gas into a processing vessel being under the vacuum atmosphere through a source gas supply unit such that a source of the source gas is adsorbed onto a substrate in the processing vessel; repeating, a plurality of times, a sequence of operations of supplying a doping gas containing the doping element into the processing vessel through a doping gas supply unit, followed by sealing the doping gas inside the processing vessel, followed by vacuum-exhausting the processing vessel; supplying a reaction gas into the processing vessel through a reaction gas supply unit such that the reaction gas reacts with the source to produce a reaction product; and replacing an internal atmosphere of the processing vessel, the replacing being performed between the operations, wherein the repeating includes supplying a backflow prevention gas into the processing vessel through the source gas supply unit, the doping gas supply unit and the reaction gas supply unit.

According to another embodiment of the present disclosure, there is provided an apparatus of forming a thin film containing a doping element in a vacuum atmosphere, including: a processing vessel configured to air-tightly accommodate a plurality of substrates; a source gas supply unit configured to supply a source gas into the processing vessel; a doping gas supply unit configured to supply a doping gas containing the doping element into the processing vessel; a reaction gas supply unit configured to supply a reaction gas into the processing vessel such that the reaction gas reacts with a source contained in the source gas to produce a reaction product; a vacuum pump configured to vacuum-exhaust the processing vessel through an exhaust port; and a control unit configured to output a control signal to perform a doping process, a reaction gas supply process using the reaction gas supply unit, and a replacement process, wherein the doping process includes repeating, a plurality of times, a sequence of operations of controlling the source gas supply unit to supply the source gas into the processing vessel being under the vacuum atmosphere such that a source of the source gas is adsorbed onto the substrate; followed by controlling the doping gas supply unit to supply the doping gas into the processing vessel such that the doping gas is sealed in the processing vessel; followed by controlling the vacuum pump to vacuum-exhaust the processing vessel, and wherein the replacement process includes replacing an internal atmosphere of the processing vessel and is performed between the control operations of the doping process, wherein the control unit outputs a control signal to perform the doping process while controlling the source gas supply unit, the doping gas supply unit and the reaction gas supply unit to inject a backflow prevention gas into the processing vessel.

According to another embodiment of the present disclosure, there is provided a non-transitory computer-readable storage medium storing a computer program operating on a computer, wherein the computer program comprises a group of steps for performing the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
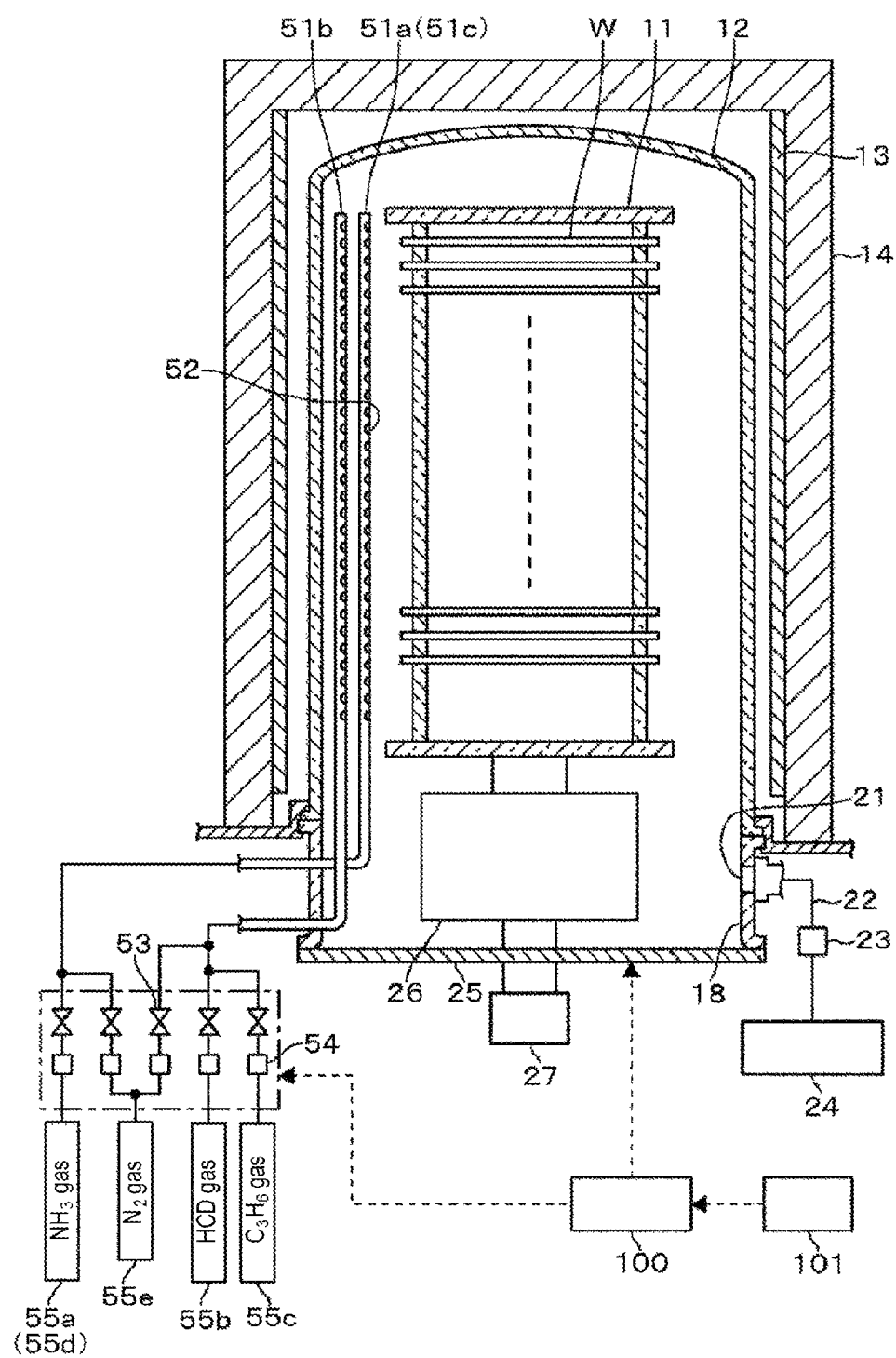
FIG. 1 is a longitudinal sectional view showing an example of a vertical heat treatment apparatus of the present disclosure.
Figure 2:
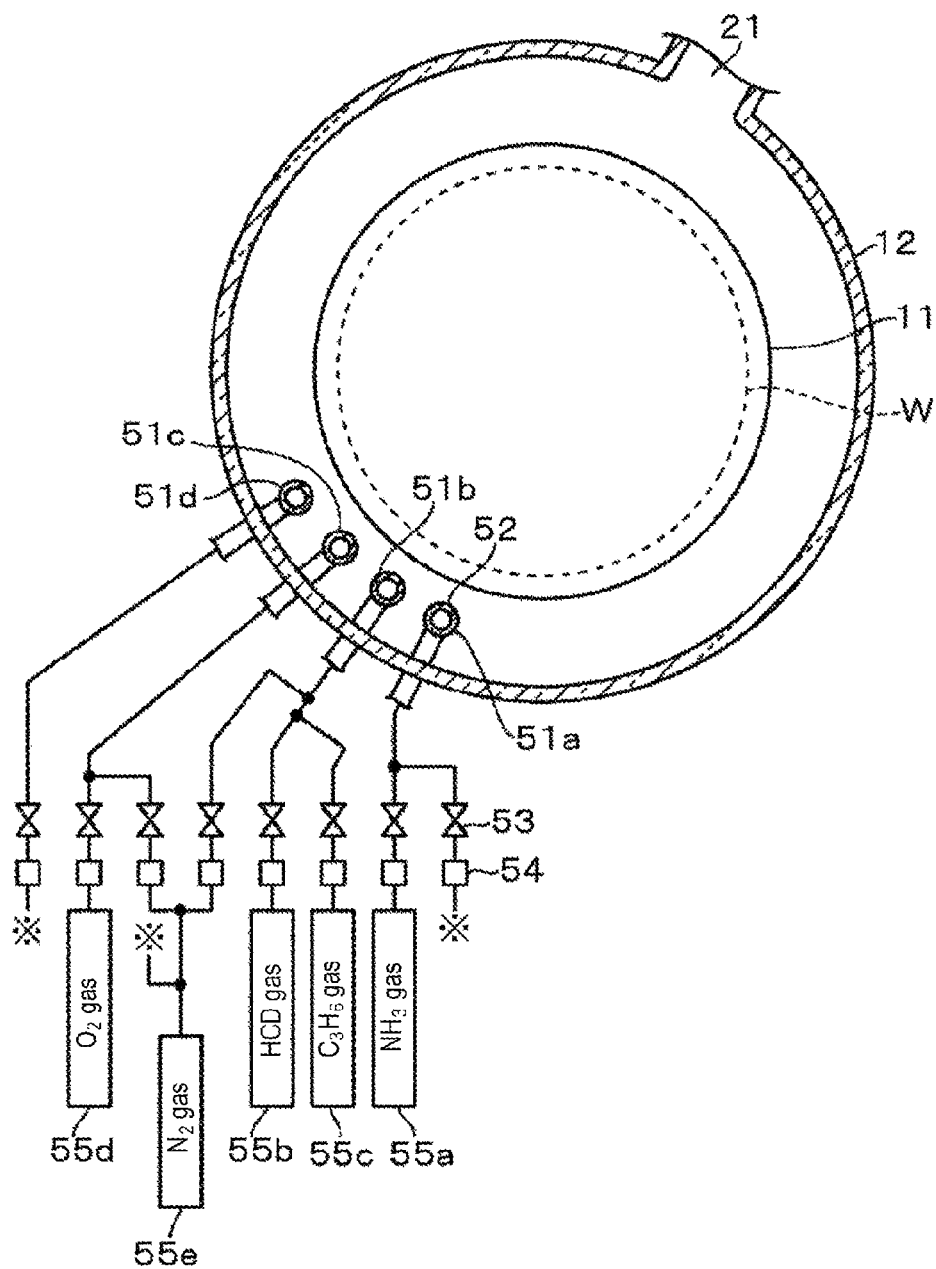
FIG. 2 is a transverse sectional view of the vertical heat treatment apparatus.

A configuration of a film forming apparatus 10, which performs a film forming method according to an embodiment of the present disclosure, will be described with reference to FIGS. 1 and 2. As shown in FIGS. 1 and 2, the film forming apparatus 10 includes a wafer boat 11 used as a substrate holding unit, and a reaction tube 12. The wafer boat 11 is configured to load a plurality of (e.g., 150) wafers W thereon in a shelf pattern. The reaction tube 12 used as a processing vessel is configured to air-tightly accommodate the wafer boat 11 therein, and performs a process of forming a thin film on each of the wafers W collectively. The film forming apparatus 10 configured as above constitutes a so-called vertical heat treatment apparatus. A substantially cylindrical heating furnace body 14 having an opened bottom portion is installed outside the reaction tube 12. A heater 13 used as a heating mechanism is disposed on an inner wall surface of the heating furnace body 14 along a circumferential direction. Reference numeral 18 in FIG. 1 designates a flange part for air-tightly holding the reaction tube 12 from below.

As shown in FIGS. 1 and 2, a plurality of (e.g., four) gas nozzles (or gas injectors) 51a to 51d are arranged step-by-step in a position laterally spaced apart from the wafer boat 11 inside the reaction tube 12. In this embodiment, as shown in FIG. 2, the first reaction gas nozzle 51a, the source gas nozzle 51b, the second reaction gas nozzle 51c and the purge gas nozzle 51d are arranged clockwise as viewed from top. For the sake of simplicity, in FIG. 1, the first reaction gas nozzle 51a (or the second reaction gas nozzle 51c) is shown to be laterally spaced apart from the source gas nozzle 51b, and the purge gas nozzle 51d is omitted.

As shown in FIG. 2, the first reaction gas nozzle 51a is coupled to an ammonia gas supply source 55a configured to supply an ammonia gas as a first reaction gas and an $N_2$ gas supply source 55e configured to supply an nitrogen ($N_2$) gas as a purge gas. The source gas nozzle 51b is coupled to an HCD gas supply source 55b configured to supply a hexachlorodisilane (HCD) gas as a source gas, a $C_3H_6$ gas supply source 55c configured to supply a propylene ($C_3H_6$) gas as a doping (additional) gas, and the $N_2$ gas supply source 55e. The second reaction gas nozzle 51c is coupled to an $O_2$ gas supply source 55d configured to supply an oxygen ($O_2$) gas as a second reaction gas and the $N_2$ gas supply source 55e. The purge gas nozzle 51d is coupled to the $N_2$ gas supply source 55e.

As shown in FIGS. 1 and 2, in a lateral surface facing the wafer boat 11 in each of the gas nozzles 51a to 51d, a plurality of gas injection holes 52 is formed at a vertical regular interval along the length direction of the wafer boat 11. In FIGS. 1 and 2, reference numerals 53 and 54 designate a valve and a flow rate controller, respectively. In this embodiment, the first and second reaction gas nozzles 51a and 51c constitute a reaction gas supply unit, and the source gas nozzle 51b constitutes both a source gas supply unit and a doping gas supply unit. The purge gas nozzle 51d constitutes a purge gas supply unit.

As shown in FIG. 1, an exhaust port 21 is formed in a sidewall opposite the gas nozzles 51a to 51d in the flange part 18. The exhaust port 21 is connected to an exhaustion channel 22 which is coupled to a vacuum pump 24 through a pressure control part 23 such as a butterfly valve. A substantially disc-shaped lid 25 is installed below the flange part 18. Specifically, the lid 25 is air-tightly brought into contact with a lower outer circumferential portion (flange surface) of the flange part 18 in a circumferential direction. The lid 25 is configured to be elevatable together with the wafer boat 11 by a boat elevator (not shown). In FIG. 1, reference numerals 26 and 27 designate a heat insulator and a rotating mechanism, respectively.

As shown in FIG. 1, the vertical heat treatment apparatus 10 is provided with a control unit 100 including a computer for controlling the entire operation of the apparatus 10. The control unit 100 includes a memory that stores a program used in performing a film forming process (which will be described later). The program is installed into the control unit 100 from a storage part 101 that is a storage medium such as a hard disc, a compact disc, a magneto-optical disc, a memory card or a flexible disc.

Figure 3:
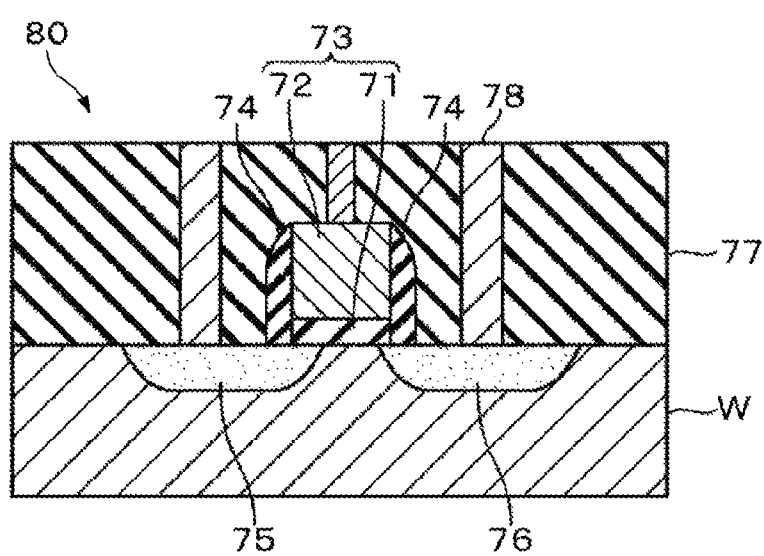
FIG. 3 is a longitudinal sectional view showing a semiconductor device to which a thin film formed by the vertical heat treatment apparatus is applied.

Now, an example of a semiconductor device 80 to which a thin film formed by the vertical heat treatment apparatus 10 configured as above is applied, will be described with reference to FIG. 3. FIG. 3 shows a structure of a gate electrode as described in the BACKGROUND section. A substantially cylindrical layered structure 73 of a gate insulation film 71 followed by a gate electrode 72 is formed on a surface of a wafer W. A sidewall 74 is formed on a lateral peripheral surface of the structure 73. The sidewall 74 is made of a thin film which is formed by a film forming method of the present disclosure (which will be described later).

In addition, a source region 75 and a drain region 76 are formed on the surface of the wafer W such that the structure 73 is laterally disposed therebetween. An insulation film 77 made of, e.g., a silicon oxide film, is formed on the surface of the wafer W to cover the structure 73, the source region 75 and the drain region 76. Electrodes 78 are formed in the insulation film 77 to vertically pass through the insulation film 77 in respective positions corresponding to the gate electrode 72, the source region 75 and the drain region 76.

The semiconductor device 80 shown in FIG. 3 is obtained by: forming the thin film to cover the structure 73 using the film forming method of the present disclosure (which will be described later); forming a mask (not shown) patterned to cover only a portion corresponding to the sidewall 74; removing the remaining portion except for the portion of the sidewall 74 by a wet etching using, e.g., a hydrofluoric acid solution; forming the insulation film 77; forming contact holes in the insulation film 77; filling the contact holes with the electrodes 78.

Figure 4A:
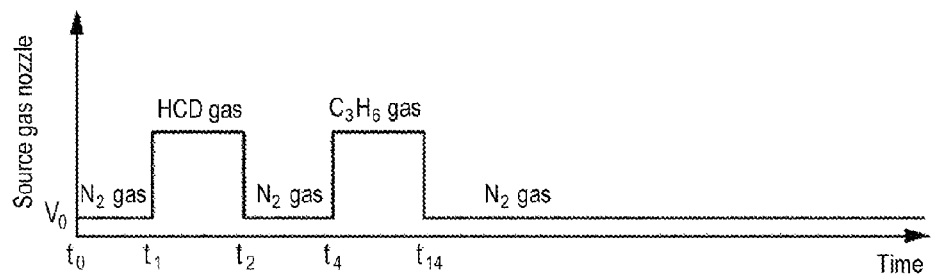
FIGS. 4A to 4D are sequence diagrams showing an example of a thin film forming method.
Figure 4B:
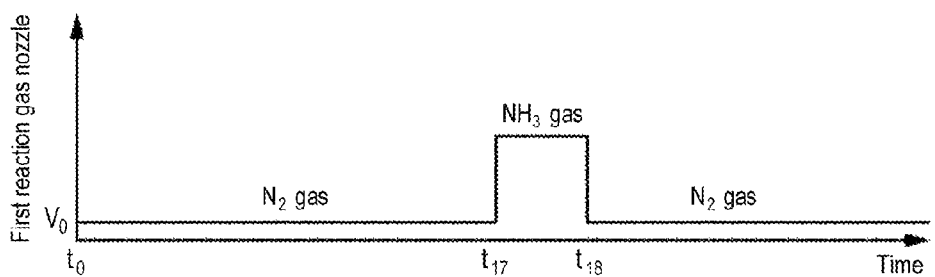
Figure 4C:
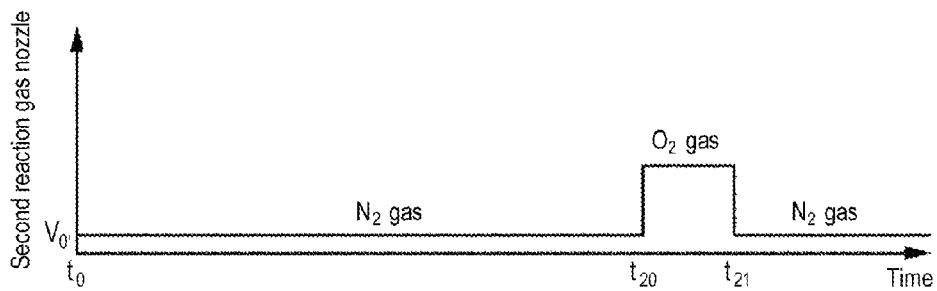

Hereinafter, the film forming method of the present disclosure will be described in detail. First, an outline of the film forming method will be described. As shown in FIGS. 4A to 4C, the film forming method of the present disclosure employs a process including a sequence of steps of individually supplying the source gas, the doping gas, the first reaction gas and the second reaction gas toward the wafer W. Specifically, FIG. 4A shows gases injected from the source gas nozzle 51$b$, and FIGS. 4B and 4C show gases respectively injected from the first reaction gas nozzle 51$a$ and the second reaction gas nozzle 51$c$. In this embodiment, as described above, both the source gas (the HCD gas) and the doping gas (the $C_3H_6$ gas) are injected from the source gas nozzle 51$b$. In this embodiment, a process of filling the reaction tube 12 with the doping gas, followed by stopping the supply of the doping gas and a vacuum-exhaust of the reaction tube 12 is repeated such that a sealing state where the doping gas is hermetically sealed in the reaction tube 12 is repetitively achieved. This will be described in detail later.

Figure 4D:
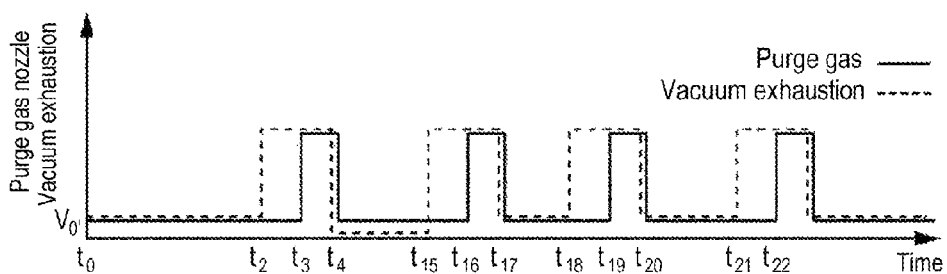

FIG. 4D shows a sequence of steps of injecting the purge gas through the purge gas nozzle 51$d$ and vacuum-exhausting the reaction tube 12. As shown in FIG. 4D, a replacement step which includes vacuum-exhausting the reaction tube 12 and supplying the purge gas is performed to switch the supply of the respective gases. In FIG. 4, a supply amount of each gas and an exhaust flow rate of the reaction tube 12 are schematically shown.

When performing the switching of the gases in the above steps, if each of the gas nozzles 51$a$ to 51$d$ completely stops supply of the respective gases, an internal atmosphere of the reaction tube 12 may flow back to each of the gas nozzles 51$a$ to 51$d$. This contaminates interiors of the gas nozzles 51$a$ to 51$d$. Therefore, according to the present disclosure, as shown in FIGS. 4A and 4C, the gas nozzle 51$a$, 51$b$ or 51$c$, when not supplying respective gases (the source gas, the doping gas or the first and second reaction gases), supply the purge gas as a backflow prevention gas at an extremely small flow rate V0. In addition, as shown in FIG. 4D, the purge gas nozzle 51$d$ continues to supply the purge gas at the flow rate V0 in steps other than the replacement step.

In the meantime, when each of the gas nozzles 51$a$ to 51$d$ supplies the backflow prevention gas into the reaction tube 12, the doping gas supply step stops the vacuum-exhaust of the reaction tube 12 such that the doping gas is hermetically sealed in the reaction tube 12. As such, in the doping gas supply step, the doping gas in the reaction tube 12 is diluted by the backflow prevention gas, which may cause a variation in degree of dilution of the doping gas in the vertical direction. Thus, in the present disclosure, when the doping gas is hermetically sealed in the reaction tube 12, the internal atmosphere of the reaction tube 12 is prevented from flowing back to each of the gas nozzles 51$a$ to 51$d$, thus suppressing a variation in concentration of the doping gas from being generated. This will be described later.

Next, the aforementioned steps will be described in detail with reference to FIGS. 4A to 4D and 5. First, as shown in FIGS. 4A to 4D, the wafer boat 11 having the plurality of wafers W loaded therein is carried air-tightly into the reaction tube 12 which is pre-heated at a film formation temperature (e.g., 600 degrees C.). Thereafter, the interior of the reaction tube 12 is vacuum-exhausted such that an internal pressure of the reaction tube 12 is set to a processing pressure (time t0). In addition, the purge gas used as the backflow prevention gas (the $N_2$ gas) is supplied into the reaction tube 12 through each of the gas nozzles 51$a$ to 51$d$. The flow rate V0 of the backflow prevention gas falls within a range of 10 to 500 sccm, and in some embodiments, a range of 50 to 200 sccm.

Subsequently, as shown in FIG. 4A, the source gas nozzle 51$b$ supplies (or injects) the source gas (the HCD gas) into the reaction tube 12 instead of the backflow prevention gas (time t1). Specifically, the source gas nozzle 51$b$ stops the supply of the backflow prevention gas, and simultaneously starts to supply the source gas at a flow rate of, e.g., 300 sccm. When the source gas is brought into contact with a surface of each of the wafers W, a silicon element contained in the source gas, together with another element contained in the source gas, is adsorbed onto the surface of each of the wafers W, thereby forming an adsorption layer.

Thereafter, as shown in FIGS. 4A and 4D, the source gas nozzle 51$b$ supplies the backflow prevention gas instead of the source gas (i.e., the source gas nozzle 51$b$ stops the supply of the source gas), and simultaneously, the interior of the reaction tube 12 is vacuum-exhausted (time t2). Subsequently, as shown in FIG. 4D, the purge gas nozzle 51$d$ supplies the purge gas at an increased flow rate while maintaining the interior of the reaction tube 12 at the vaccum-exhaustion state so that the internal atmosphere of the reaction tube 21 is replaced with an inert atmosphere (time t3).

Subsequently, at time t4, the purge gas nozzle 51$d$ decreases (or returns) the flow rate of the purge gas to the initial flow rate V0 enough to prevent back-flowing the internal atmosphere of the reaction tube 12, and simultaneously, an opening degree of the pressure control part 23 is set to a complete close such that the vacuum-exhaust of the reaction tube 12 is stopped. At time t4, as shown FIG. 4A and FIGS. 5A to 5C, a step of implanting a doping element in the adsorption layer is initiated. In FIG. 4A, the step of implanting the doping element in the adsorption layer is schematically depicted.

Figure 5A:
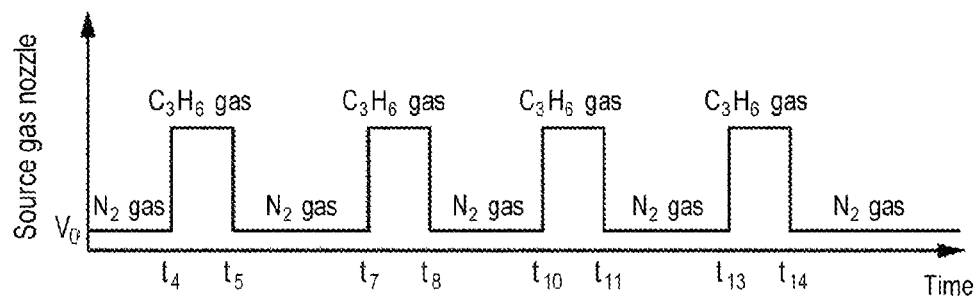
FIGS. 5A to 5C are detailed enlarged views showing the sequence of FIG. 4A.
Figure 5B:
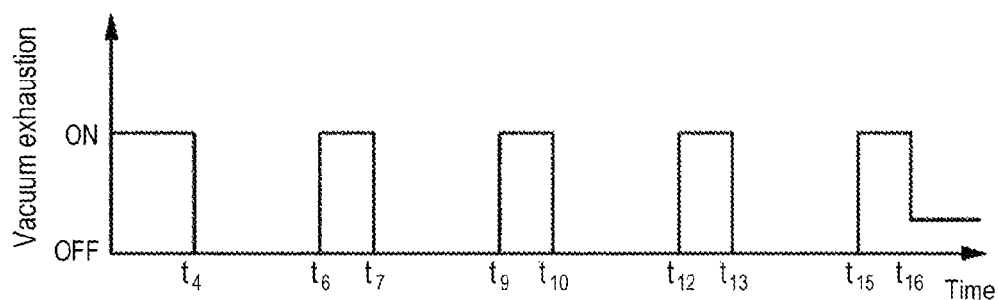
Figure 5C:
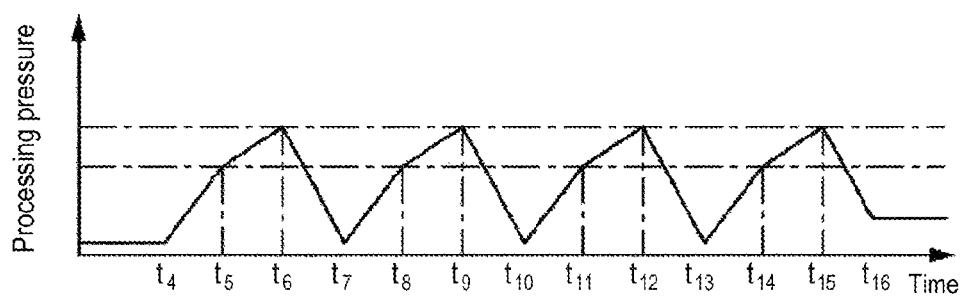

FIGS. 5A to 5C are enlarged views showing the step of implanting the doping element shown in FIG. 4A in detail. Specifically, FIG. 5A shows a sequence in which the source gas nozzle 51b supplies the doping gas for a period of time from a time slightly prior to time t4 to a time when the implanting step is finished. FIG. 5B shows on/off timings of the vacuum-exhaust for the period of time. FIG. 5C is a graph showing a variation in an internal processing pressure of the reaction tube 12 for the period of time.

First, as shown in FIG. 5A, at time t4, the source gas nozzle 51b starts to supply the doping gas (the $C_3H_6$ gas) at a flow rate of, e.g., 3000 sccm. As shown in FIGS. 4B to 4D, the gas nozzles 51a, 51c and 51d other than the source gas nozzle 51b inject the backflow prevention gas at the flow rate V0. As described above, the vacuum-exhaust of the reaction tube 12 is stopped at time t4. Thus, as shown in FIG. 5C, the internal processing pressure of the reaction tube 12 is increased by the doping gas and the backflow prevention gas.

Thereafter, at time t5 when the internal processing pressure of the reaction tube 12 reaches a range of 133 to 13,300 Pa (e.g., 1900 Pa in this embodiment), the supply of the doping gas is stopped such that the interior of the reaction tube 12 is hermetically sealed (closed). At this time, the source gas nozzle 51b injects the backflow prevention gas at the flow rate V0. Thus, as shown in FIG. 5C, the internal processing pressure of the reaction tube 12 is further increased up to a pressure near, e.g., 3150 Pa, even after time t5.

Figure 6:
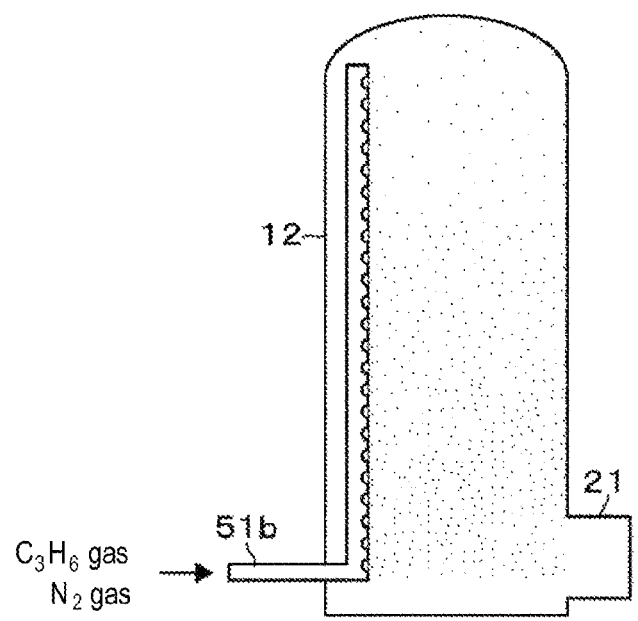
FIGS. 6 to 9 are schematic views showing a distribution of gas obtained in a reaction tube of the vertical heat treatment apparatus when forming a thin film, respectively.
Figure 7:
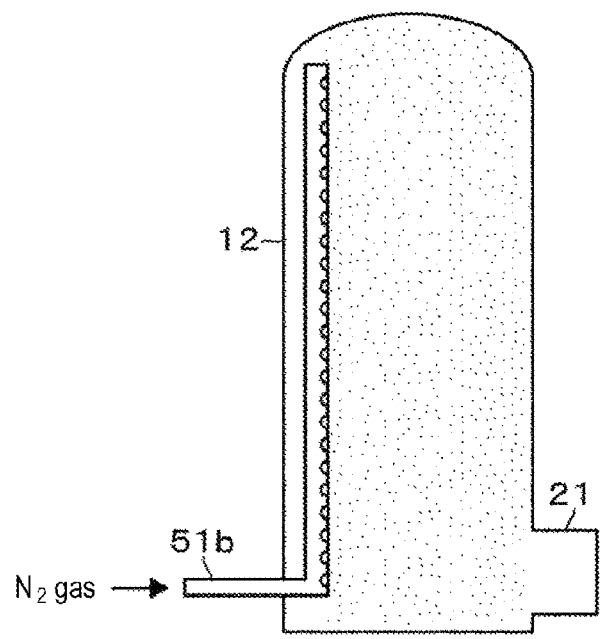

In the reaction tube 12, the doping gas has a vertical variation in concentration at time t5 when the supply of the doping gas is stopped or a time prior to time t5. Specifically, as shown in FIG. 6, a large amount of the doping gas is injected from a lower portion rather than an upper portion of the source gas nozzle 51b. This allows the doping gas to be distributed at a high concentration in a lower portion rather than an upper portion of the reaction tube 12. However, the reaction tube 12 into which the doping gas is introduced is hermetically closed and is maintained at the sealed state up to time t6. Thus, as shown in FIG. 7, the concentration of the doping gas is uniform over the interior of the reaction tube 12. A period of time (a time interval between time t6 and time t5) for which the doping gas is hermetically sealed in the reaction tube 12 is, for example, 5 to 90 seconds.

Since the reaction tube 12 is filled with the doping gas, the doping elements are implanted into the adsorption layer on the surface of each of the wafers W so that the silicon elements and the carbon elements are mixed together. As described above, the concentration of the doping gas is controlled to be uniform over the interior of the reaction tube 12, thus making an implantation ratio of the doping elements into the adsorption layer in each of the wafers W uniform. As a specific example of the implantation ratio, a ratio of the doping element to the silicon element in the adsorption layer may fall within a range of 1 to 20%, and in some embodiments, a range of 3 to 10%.

Figure 8:
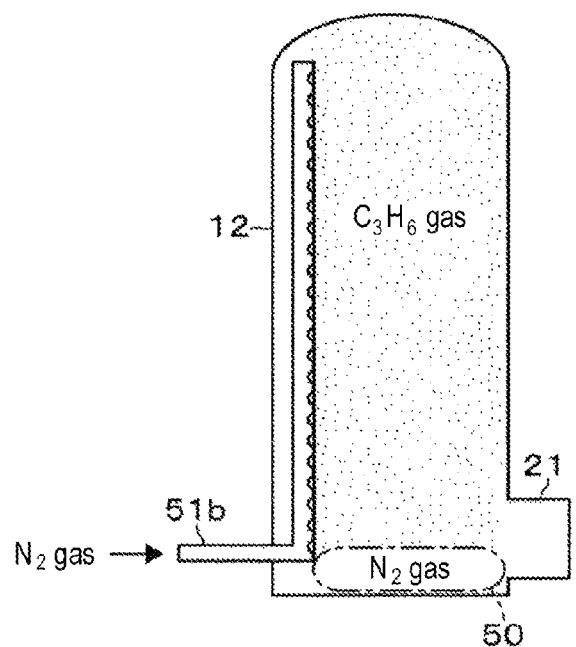

Further, as described above, even at a time after time t5 when the doping gas is hermetically sealed in the reaction tube 12, all the gas nozzles 51a, 51c and 51d and the source gas nozzle 51b continue to inject the backflow prevention gas into the reaction tube 12. As shown in FIG. 8, this forms a stay zone 50 in which the backflow prevention gas stays in the lower portion of the reaction tube 12 (in the vicinity of the lid 25) for example. That is to say, an internal pressure of each of the gas nozzles 51a to 51d decreases as it goes from a lower end portion toward an upper end portion, so that an injection amount of a respective gas is increased as it goes from the upper end portion toward the lower end portion. Therefore, while the doping gas is gradually diluted by the backflow prevention gas, the degree of the dilution tends to increase in the lower portion rather than the upper portion of the reaction tube 12.

Figure 9:
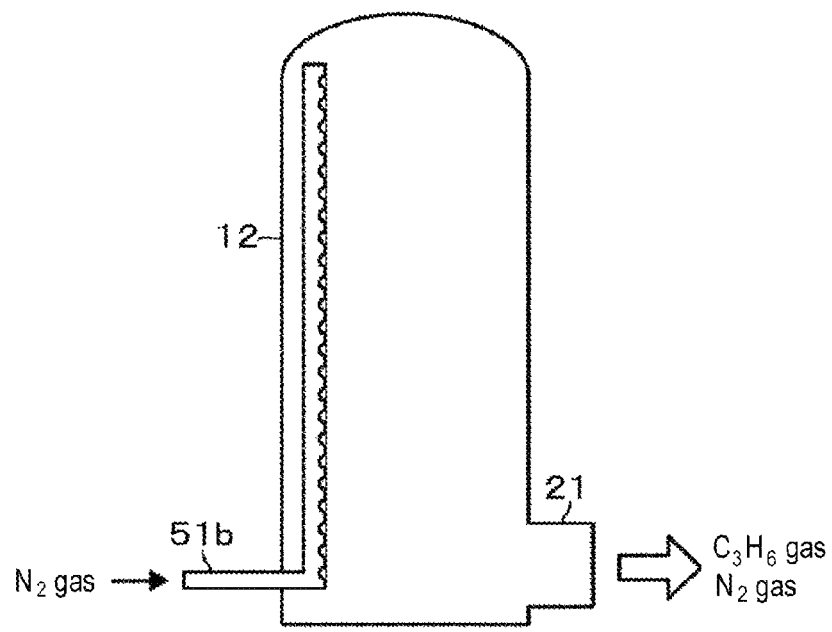

However, after the doping gas is hermetically sealed in the reaction tube 12 up to time t6, as shown in FIGS. 5B and 9, the opening degree of the pressure control part 23 is set to be completely open from time t6 such that the reaction tube 12 is vacuum-exhausted. Further, the period of time (the time interval between time t5 and time t6) for which the doping gas is diluted by the backflow prevention gas in the reaction tube 12 is set to 5 seconds to 90 seconds as described above. Thus, no variation in concentration of the doping gas occurs inside the reaction tube 12. Specifically, assuming that a flow rate of the doping gas supplied into the reaction tube 12 is "V1", a total flow rate "V2" of the backflow prevention gas, which is supplied into the reaction tube 12 in the time interval between time t5 and time t6, is set as the following equation:

$$V2 \leq V1 \times 3\% \qquad \text{Eq. (1)}$$

The above equation Eq. (1) may be represented as follows using an inner volume "V3" of the reaction tube 12.

$$V2 \leq V3 \times 0.5\% \qquad \text{Eq. (2)}$$

Therefore, before a vertical gradient in concentration of the doping gas inside the reaction tube 12 is increased, the doping gas is exhausted, together with the backflow prevention gas, from the reaction tube 12. This prevents the doping element from being unevenly implanted into the adsorption layer formed on each of the wafers W.

Subsequently, the sequence of steps of: supplying the doping gas into the reaction tube 12; hermetically sealing the doping gas in the reaction tube 12; and vacuum-exhausting the reaction tube 12 is repeated plural times (e.g., three in this embodiment) starting at time t7. Specifically, at time t7, the vacuum-exhaust of the reaction tube 12 is stopped and the source gas nozzle 51b supplies the doping gas instead of the backflow prevention gas. The source gas nozzle 51b continues to supply the doping gas up to time t8, and stops supplying the doping gas (i.e., supply the backflow prevention gas instead of the doping gas) at time t9. Thereafter, at time t9, the doping gas and the backflow prevention gas are exhausted from the reaction tube 12.

The above sequence is further repeated twice. That is to say, stopping the vacuum-exhaust of the reaction tube 12 and resuming the supply of the doping gas (times t10 and t13), stopping the supply of the doping gas (times t11 and t14), and starting the vacuum-exhaust of the reaction tube 12 (times t12 and t15) are performed such that the doping element is implanted into the adsorption layer of each of the wafers W at a uniform and desired content over the interior of the reaction tube 12. As described above, the step of uniformly doping each of the wafers W with the doping element is performed four times, which makes it possible to uniformly implant the doping element into the adsorption layer of each of the wafers W at a high concentration.

Subsequently, as shown FIG. 4D, at time 616, the internal pressure of the reaction tube 12 is set to a setting pressure by adjusting the opening degree of the pressure control part 23, and simultaneously, the internal atmosphere of the reaction tube 12 is replaced with a purge gas atmosphere by the purge gas supplied from the purge gas nozzle 51d. Thereafter, at time t17, the flow rate of the purge gas supplied from the purge gas nozzle 51d is set to be the flow rate V0 as described above, and simultaneously, the first reaction gas nozzle 51a supplies the ammonia gas ($NH_3$ gas) at a flow rate of, e.g., 5000 sccm. That is to say, the gas supplied from the first reaction gas nozzle 51a is switched from the backflow prevention gas to the ammonia gas. When the ammonia gas is brought into contact with the adsorption layer formed on the surface of the wafer W, the adsorption layer is nitrided, thereby forming a first reaction layer containing silicon, carbon and nitrogen.

Thereafter, at time t18, the first reaction gas nozzle 51a stops to supply the ammonia gas (i.e., starts to supply the backflow prevention gas) and the interior of the reaction tube 12 is vacuum-exhausted. Subsequently, at time t19, the internal atmosphere of the reaction tube 12 is replaced with the purge gas atmosphere by the purge gas supplied from the purge gas nozzle 51d. Subsequently, the flow rate of the purge gas supplied from the purge gas nozzle 51d is returned to the initial flow rate V0, and simultaneously, the second reaction gas nozzle 51c starts to supply the oxygen gas instead of the backflow prevention gas. That is to say, at time t20, the second reaction gas nozzle 51c stops supplying the backflow prevention gas and starts to supply the oxygen gas at a flow rate of, e.g., 5000 sccm, into the reaction tube 12.

When the oxygen gas is brought into contact with the first reaction layer on the surface of the wafer W, the oxygen gas reacts with (oxidizes) the silicon and nitrogen elements contained in the first reaction layer, thereby forming a second reaction layer consisting of silicon, carbon, nitrogen and oxygen. Since the content of carbon in each of the aforementioned steps is uniform for every wafer W, the content of the silicon element is also uniform. This makes the proportion of the oxygen element in the second reaction layer uniform for every wafer W, as can be seen from the results of the embodiment as described above.

Thereafter, at time t 21, the second reaction gas nozzle 51c stops supplying the oxygen gas and starts to supply the backflow prevention gas, and the interior of the reaction tube 12 is vacuum-exhausted. Subsequently, at time t22, the internal atmosphere of the reaction tube 12 is replaced with the purge gas atmosphere by the purge gas supplied from the purge gas nozzle 51d. In this way, the process of forming the second reaction layer (reaction product) is finished. Thereafter, a film forming cycle including the steps of forming the adsorption layer, doping the adsorption layer with the doping element, and nitriding/oxidizing the adsorption layer is repeated plural times to form a plurality of second reaction layers. The thin film is formed by laminating the plurality of second reaction layers.

As described above, according to the above embodiment, the doping of the adsorption layer formed on the wafer W with the doping element is implemented by supplying the doping gas into the reaction tube 12, followed by stopping the supply of the doping gas and the vacuum-exhaust of the reaction tube 12, followed by hermetically sealing the doping gas in the reaction tube 12. When the doping gas is hermetically sealed in the reaction tube 12, both the doping gas and the backflow prevention gas are exhausted from the reaction tube 12 before the vertical variation in concentration of the doping gas in the reaction tube 12 is increased up to a certain level by the backflow prevention gas. Further, the step of hermetically sealing the doping gas in the reaction tube 12 and the step of vacuum-exhausting the reaction tube 12 are performed in this order four times, which makes it possible to maintain a uniform doping amount of the doping element for every wafer W while avoiding the contamination of each of the gas nozzles 51a to 51d. Accordingly, a dielectric constant of the thin film and an etching property (etching resistance) of the thin film to the hydrofluoric acid solution can be evenly applied for every wafer W.

With this configuration, the formation of the sidewall 74 using the thin film suppresses the parasitic capacitance between the gate electrode 72 and the electrodes 78 from being generated while ensuring the etching resistance of the sidewall 74 to the hydrofluoric acid solution. In other words, according to the present disclosure, it is possible to allow the gate electrode 72 and the electrodes 78 to come close to each other while suppressing a capacitance coupling between the gate electrode 72 and the electrodes 78. This minimizes a size of the semiconductor device.

Further, a relationship between the supply amount V1 of the doping gas into the reaction tube 12 and the supply amount V2 of the backflow prevention gas (which is supplied into the reaction tube 12 together with the doping gas), or a relationship between the supply amount V1 and the inner volume V3 of the reaction tube 12 is set as the equations Eqs. (1) and (2) as described above. This allows a composition of the thin film in each of the wafers W to have a level applicable to the sidewall 74 of the semiconductor device. Further, by adjusting a period of time allocated to the step of hermetically sealing the doping gas or the number of repetitions of this step, it is possible to adjust a doping amount of the doping element in the thin film, i.e., the dielectric constant of the thin film or the etching resistance of the thin film to the hydrofluoric acid solution.

Next, a skeleton structure of a compound constituting the thin film will be described. The thin film consists of the four elements as described above, while a basic structure is a silicon nitride ($Si_3N_4$) consisting of silicon and nitrogen elements. In such a structure, a portion of the silicon element is replaced with a carbon element, or a portion of the nitrogen element is replaced with an oxygen element, thereby forming the thin film having a four-component system. Only the "portion" of the silicon element or the nitrogen element is replaced with the carbon element or the oxygen element, and all of it is not replaced. For this reason, the composition ratio of each element in the thin film formed according to the present disclosure is not stoichiometrically obtained, and may be easily changed depending on film forming conditions.

Specifically, for example, a proportion of the carbon element in the thin film increases as the supply amount or supply time of the doping gas increases. In the meantime, the proportion of the carbon element in the thin film decreases as the supply amount or supply time of the doping gas decreases. Therefore, the film forming method of the present disclosure may be effectively employed in forming a thin film which is difficult to have a constant composition ratio.

Figure 10:
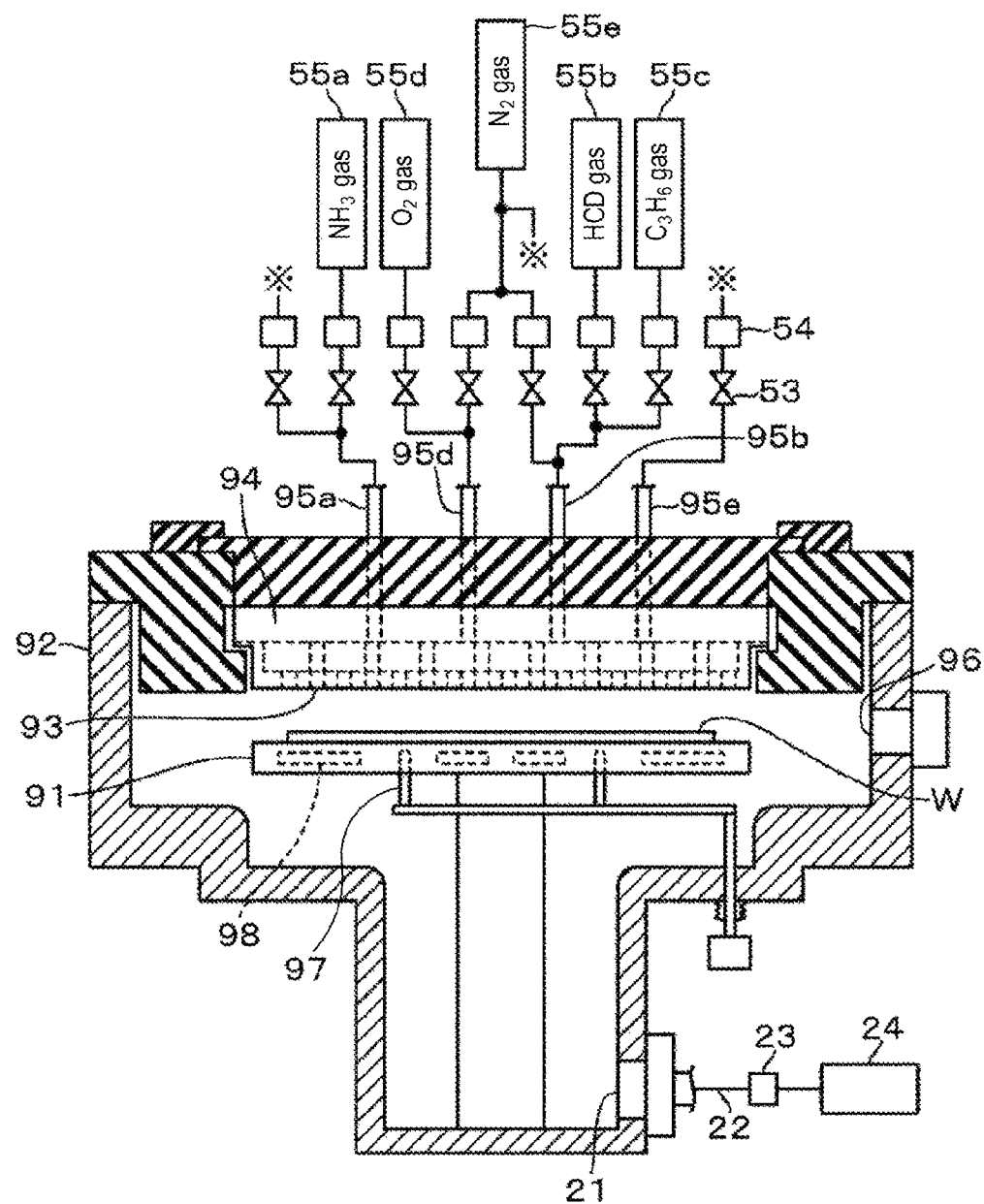
FIG. 10 is a longitudinal sectional view showing another example of an apparatus used in performing the film forming method of the present disclosure.

While in the above embodiment, the film forming apparatus configured to perform the film forming method of the present disclosure has been described to include the exhaust port 21 which is formed in the lateral peripheral surface of the lower portion of the reaction tube 12, the present disclosure is not limited thereto. As an example, the exhaust port 21 may be formed in a ceiling surface of the reaction tube 12. In some embodiments, the reaction tube 12 may be configured to have a double tube structure constituted by an inner tube and an outer tube. Further, a slit-shaped exhaust port may be longitudinally formed in a wall surface of the inner tube such that an internal atmosphere of the reaction tube 12 is exhausted through the exhaust port. Further, the film forming method of the present disclosure may be applied to a single type heat treatment apparatus which performs the film forming process with respect to a single sheet of wafer W, instead of the batch type vertical heat treatment apparatus which performs the film forming process with respect to the plurality of wafers W at a time. The single type heat treatment apparatus will be briefly described with reference to FIG. 10. In FIG. 10, components identical to those of FIGS. 1 and 2 are denoted by like reference numerals, and a duplicate description thereof will be omitted.

As shown in FIG. 10, the single type heat treatment apparatus includes a mounting table 91 on which a wafer W is mounted and a processing vessel 92 configured to airtightly accommodate the mounting table 91. In a ceiling surface of the processing vessel 92, a gas shower head 94 is installed to face the mounting table 91. A plurality of gas discharge holes 93 is formed in a bottom surface of the gas shower head 94. An upper surface of the gas shower head 94 is connected to gas supply channels 95a, 95b, 95b and 95d respectively extending from the gas supply sources 55a, 55b, 55c and 55d. The gas supply channels 95a, 95b, 95d and 95e are arranged inside the gas shower head 94 such that respective gases supplied from the gas supply channels 95a, 95b, 95d and 95e are not mixed with one another. Like in FIGS. 1 and 2, the gas supply channel 95b is connected to both the doping gas supply source 55c and the source gas supply source 55b. In FIG. 10, reference numeral 96 designates a transfer port through which the wafer W is transferred, and reference numeral 97 designates lifting pins for transferring the wafer W between the mounting table 91 and an external transfer arm (not shown) through the transfer port 96. In FIG. 10, reference numeral 98 designates a heater.

Even in the single type heat treatment apparatus, a film forming cycle including the steps of supplying the source gas, the doping gas, the first reaction gas and the second reaction gas is performed plural times. Similarly, the backflow prevention gas is supplied at the flow rate V0 through the gas supply channel 95a, 95b, 95d or 95e when the source gas, the doping gas, the first reaction gas or the second reaction gases is not supplied. Therefore, like the batch type heat treatment apparatus as described above, the single type heat treatment apparatus can form a thin film having a composition ratio of a setting value or a value close to the setting value.

Examples of the doping gas may include a carbon-containing gas such as an acetylene ($C_2H_2$) gas, an ethylene ($C_2H_4$) gas or the like, instead of the propylene gas. While in the above embodiment, the film forming method has been described to supply the source gas, the doping gas, the first reaction gas and the second reaction gas in this order, the present disclosure is not limited thereto. As an example, a sequence of steps of supplying the source gas, the doping gas and the first reaction gas may be repeated plural times (e.g., twice), and subsequently, the second reaction gas may be supplied. Further, the step of hermetically sealing (or holding) the doping gas in the reaction tube 12 may be performed twice or more as can be seen from the following examples. In some embodiments, the source gas and the doping gas may be supplied to the wafer W through separate gas supply systems.

As described above, an example of the thin film formed by the film forming method of the present disclosure includes a compound obtained by replacing a portion of the element in the skeleton structure consisting of silicon and nitrogen elements. As an example, the thin film may include a Si—C—N film, a Si—B—N film, a Si—B—C—N film or a Si—B—O—C film, in addition to the Si—O—C—N film as described above. In other words, examples of the doping element may include at least one element of carbon (C) and boron (B). In a case where the boron element is used for a doping process, for example, a boron chloride ($BCl_3$) gas or a boron hydride ($B_2H_6$) gas may be used as the doping gas. The film forming method of the present disclosure as described above, which repetitively performs the sequence of steps of supplying a doping gas containing a respective element (carbon or boron) to the wafer W, holding the doping gas and exhausting the processing atmosphere, may be employed in the doping process using the at least one element. The skeleton structure may include a compound (Si—O) consisting of silicon and oxygen elements, instead of the compound consisting of silicon and nitrogen elements. As an example, a Si—C—O film, a Si—B—C—N film or the like may be used as the skeleton structure.

Further, in the examples described above, instead of installing a gas supply unit for the purge gas (i.e., the purge gas nozzle 51d and the gas supply channel 95e), the purge gas supplied to replace the internal atmosphere of the reaction tube 12 or the processing vessel 92 may be supplied from other gas supply units (the gas nozzles 51a to 51c and the gas supply channel 95a, 95b or 95d).

In some embodiments, the source gas, the doping gas and the reaction gas (ammonia gas or oxygen gas) may be independently supplied into the reaction tube 12. Alternatively, these gases may be simultaneously supplied together with an inert gas (e.g., nitrogen gas) used as a carrier gas.

EXAMPLES

Experimental examples performed according to the present disclosure will be described.

Experimental Example 1

Experimental Example 1 has been performed to check how a refractive index of a thin film changes when a supply time of the second reaction gas (oxygen gas) is variously changed in a case of forming the thin film having the four-component system consisting of Si—O—C—N. The same processing condition (recipe) other than the supply time of the second reaction gas was applied for each example.

Figure 11:
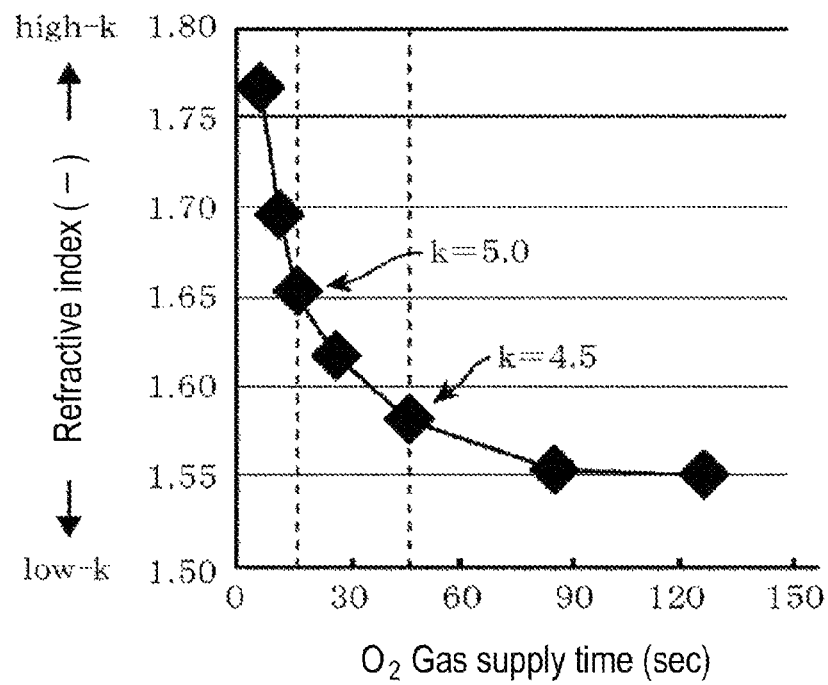
FIGS. 11 to 15 are characteristic views showing results obtained in Examples of the present disclosure, respectively.

As shown in FIG. 11, the experiments showed that the refractive index decreases as the supply time of the second reaction gas increases. Thus, it can be appreciated that a dielectric constant (k) having a correlation with the refractive index also decreases as the supply time of the second reaction gas increases.

Figure 12:
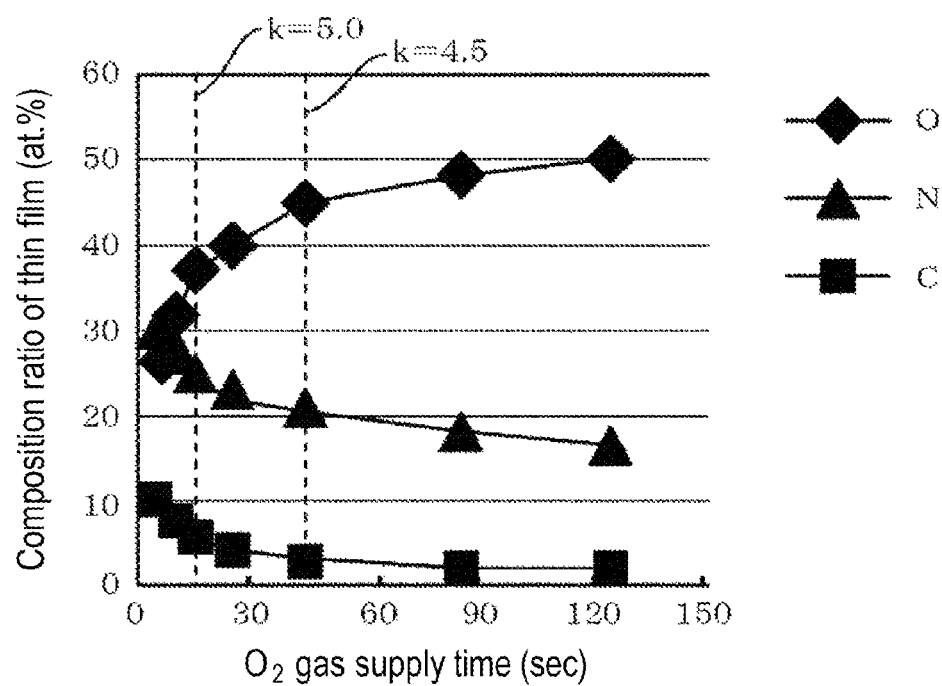

FIG. 12 shows results obtained by plotting a correlation between the supply time of the second reaction gas and a composition ratio of the thin film. Specifically, as the supply time of the second reaction gas is increased, the concentration of the carbon and nitrogen elements is decreased, while the concentration of the oxygen element is increased. When the supply time of the second reaction gas is increased, the dielectric constant of the thin film is changed (decreased) together with a change in composition ratio of a respective element in the thin film. As such, although the carbon element or the nitrogen element is implanted into the thin film once, the thin film is oxidized by an oxygen gas applied in a subsequent process, which results in a change in composition ratio. For this reasons, in the sequence of steps as described above, if the doping amount of the doping element is changed for every wafer W, the doping amount may be further changed in a subsequent oxidation process. That is to say, according to the present disclosure, the doping amount in each of the wafers W is uniformized in the step of implanting the doping element in the adsorption layer. Therefore, the composition ratio of the thin film can be uniformized even though the subsequent oxidation process is performed on the wafers W.

Experimental Example 2

Experimental Example 2 shows, in the doping of the adsorption layer with the doping element, measurements of a concentration of the carbon element contained in the thin film when a period of time (hold time) for which the hermetically sealed state of the reaction tube 12 obtained by stopping the supply of the doping gas and the vacuum-exhaust of the reaction tube 12 is maintained is variously changed. Further, in this example, the supply time of the second reaction gas was set to 15 seconds.

Figure 13:
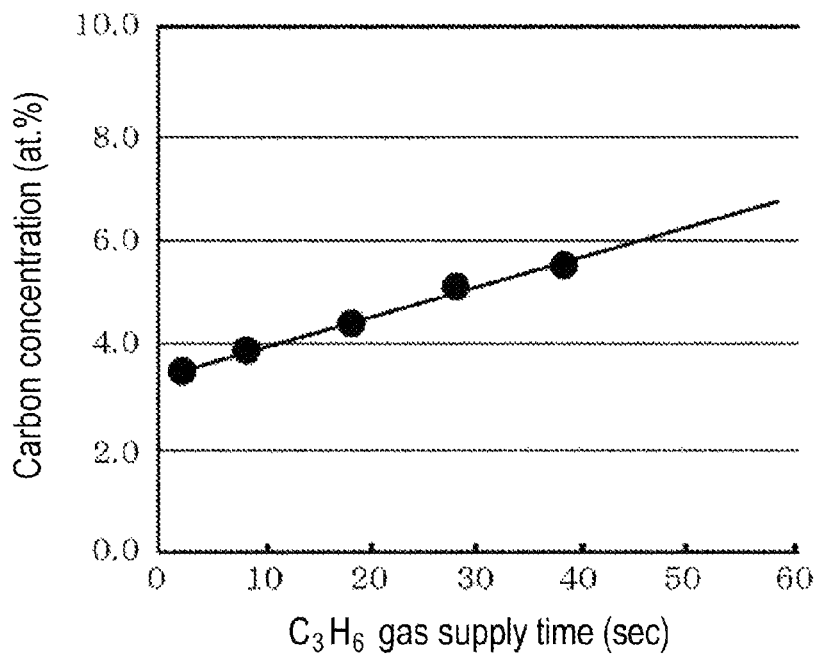

As shown in FIG. 13, this experiment has shown that the concentration of the carbon element contained in the thin film is increased as the hold time is increased.

Figure 14:
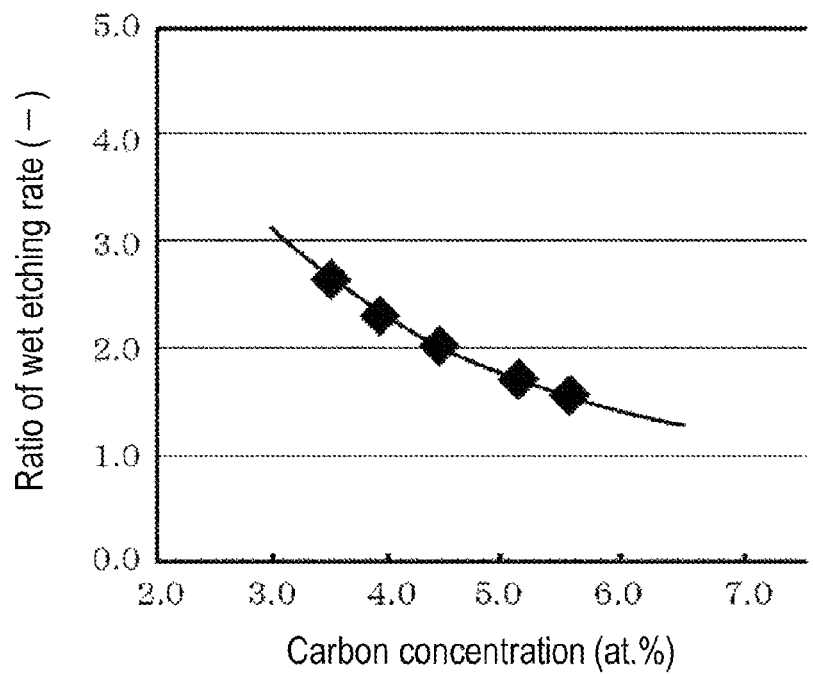

FIG. 14 shows a correlation between the concentration of the carbon element contained in the thin film and a wet etching rate of the thin film to a hydrofluoric acid. As shown in FIG. 14, this experiment has shown that the etching rate is decreased as the concentration of the carbon element is increased. In addition, FIG. 14 shows an etching rate of a silicon nitride film formed using an ammonia gas converted into plasma.

Experimental Example 3

Experimental Example 3 has been performed to determine how a quality of each thin film formed on each wafer in the wafer boat 11 is changed in a vertical direction when variously changing the hold time and the number in which a sequence of steps of hermetically sealing the doping gas in the reaction tube 12; and vacuum-exhausting the reaction tube 12 is repeated. Specifically, the hold time and the number of repetitions in each example were set as shown in the following table.

TABLE 1

|  | Hold Time | Number of Repetitions |
| --- | --- | --- |
| Experimental Example 3-1 | 240 seconds | 1 time |
| Experimental Example 3-2 | 120 seconds | 2 times |
| Experimental Example 3-3 | 60 seconds | 4 times |

Therefore, in each of Experimental Examples 3-1 to 3-3, the total of hold time is the same. In each of Experimental Examples 3-1 to 3-3, refractive indices and wet etching amounts to the hydrofluoric acid were measured for thin films of wafers W positioned in upper and lower portions of the wafer boat 11 and the thin film in a lower wafer W of the wafer boat 11. The experiments have shown that the refractive index and the concentration of the oxygen element contained in the thin film are correlated, and hence the concentration of the oxygen is increased as the refractive index is decreased. As described above, the wet etching amount is decreased (the etching becomes difficult) as the concentration of the carbon in the thin film is increased.

Figure 15:
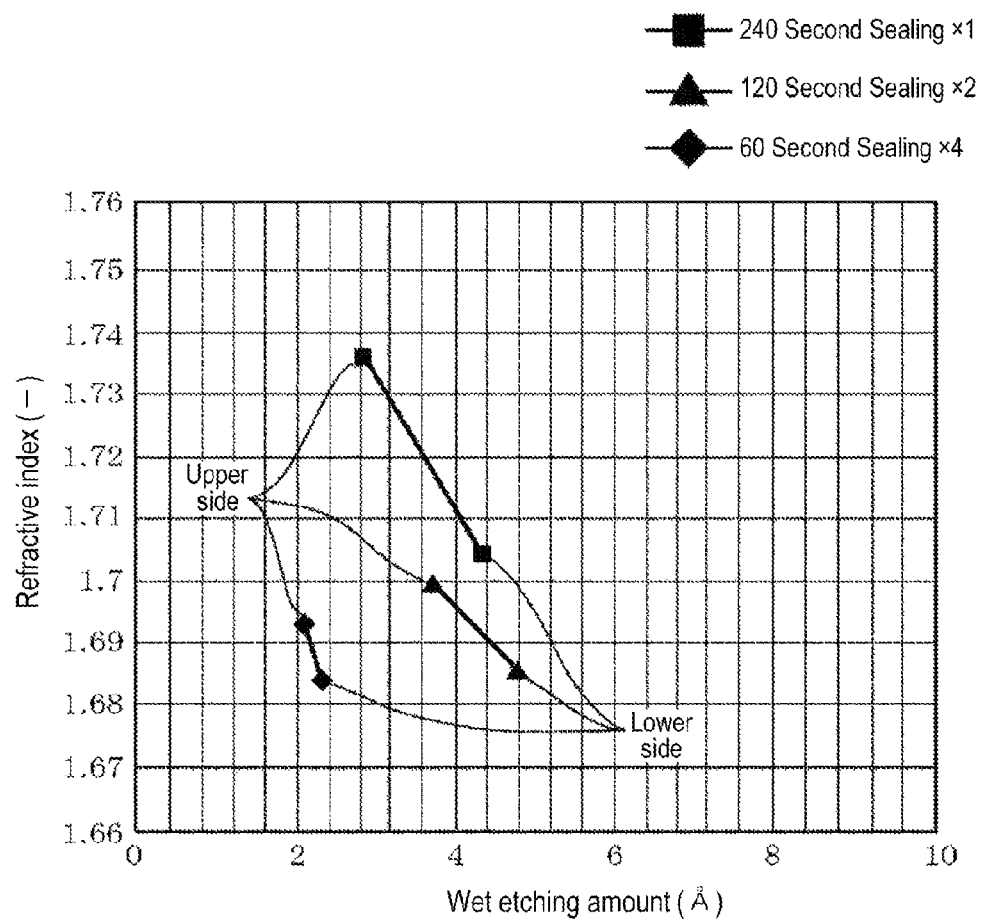

FIG. 15 shows the results obtained in each of Experimental Examples 3-1 to 3-3, wherein the horizontal axis represents a wet etching amount, and the vertical axis represents a refractive index. In each of Experimental Examples 3-1 to 3-3, as shown in FIG. 15, the results obtained from the thin films positioned in the upper and lower portions of the wafer boat 11 are plotted. The experiments have shown that as upper and lower plots representing the results obtained from the thin films positioned in the upper and lower portions of the wafer boat 11 come close to each other, a variation in the quality of the thin films in the vertical direction of the wafer boat 11 is small. Further, the experiments have shown that as the upper and lower plots are spaced apart from each other, the variation is large.

As can be seen from FIG. 15, the upper and lower plots are considerably spaced apart from each other in Experimental Example 3-1, the variation in the film quality in the vertical direction is large. On the other hand, a gap between the upper and lower plots in Experimental Example 3-2 is decreased as compared with that of Experimental Example 3-1, and hence it can be seen that the variation in the quality in the vertical direction is improved. In Experimental Example 3-3, the gap was remarkably improved, and hence a thin film having uniform quality was formed in each wafer W. Further, in each of Experimental Examples 3-1 to 3-3, the total of hold time was set to 240 seconds. Therefore, according to the present disclosure, it is possible to uniformize the quality of the thin films in the vertical direction of the wafer boat 11 while suppressing deterioration in throughput.

According to the present disclosure, when a so-called ALD process of forming a thin film by alternately supplying a source gas and a reaction gas to a substrate is performed while replacing an internal atmosphere of a processing vessel through switching of each gas, a step of hermetically sealing a doping gas in the processing vessel where a vacuum-exhaust operation is stopped, is performed between the steps of supplying these gases. In a doping process, gas supply units inject a backflow prevention gas. When the vacuum-exhaust is stopped, the doping gas is diluted by the backflow prevention gas. In order to avoid the influence of the dilution, the hermetically sealing operation of the doping gas and the vacuum-exhaust operation are repeated. Thus, as can be seen from the above embodiments, the thin film can be formed so that the composition ratio of the thin film becomes a setting value or a value close to the setting value. Further, when the batch processing is performed by the vertical heat treatment apparatus, a variation in concentration distribution of the doping gas in the vertical direction is suppressed due to the dilution of the doping gas by the backflow prevention gas. This makes it possible to maintain a concentration of a doping element at a high uniformity for every substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a thin film containing a doping element in a vacuum atmosphere, comprising:
supplying a source gas into a processing vessel being under the vacuum atmosphere through a source gas supply unit such that a source of the source gas is adsorbed onto a substrate in the processing vessel;

repeating, a plurality of times, a sequence of operations of supplying a doping gas containing the doping element into the processing vessel through a doping gas supply unit, followed by sealing the doping gas inside the processing vessel, followed by vacuum-exhausting the processing vessel;

supplying a reaction gas into the processing vessel through a reaction gas supply unit such that the reaction gas reacts with the source to produce a reaction product; and replacing an internal atmosphere of the processing vessel, the replacing being performed between the operations, wherein the repeating includes supplying a backflow prevention gas into the processing vessel through the source gas supply unit, the doping gas supply unit and the reaction gas supply unit, wherein the thin film is formed in a state in which a plurality of substrates are held by a substrate holding unit provided in a vertical reaction tube having a height greater than a width used as the processing vessel, wherein the operation of supplying a doping gas is performed in a state in which the vacuum-exhausting of the processing vessel is stopped, wherein the vacuum-exhausting is resumed after the supply of the doping gas is stopped and before a supply amount of the backflow prevention gas reaches a predetermined level of a supply amount of the doping gas, and wherein $V2 \leq V1 \times 3\%$ or $V2 \leq V3 \times 0.5\%$, wherein $V1$ is a flow rate of the doping gas supplied into the processing vessel, $V2$ is a total flow rate of the backflow prevention gas, and $V3$ is an inner volume of the processing vessel.

2. The method of claim 1, wherein the doping element includes at least one of boron and carbon.

3. The method of claim 1, wherein the reaction product includes silicon and at least one of nitrogen and oxygen.

* * * * *